United States Patent
Muraya et al.

(10) Patent No.: US 6,847,222 B2
(45) Date of Patent: Jan. 25, 2005

(54) APPARATUS FOR MEASURING VOLTAGE FLUCTUATION WAVEFORM IN SEMICONDUCTOR INTEGRATED CIRCUIT, AND SEMICONDUCTOR INTEGRATED CIRCUIT HAVING FUNCTION FOR MEASURING VOLTAGE FLUCTUATION WAVEFORM

(75) Inventors: Keisuke Muraya, Kawasaki (JP); Yoshitomo Ozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/780,610

(22) Filed: Feb. 19, 2004

(65) Prior Publication Data

US 2004/0212387 A1 Oct. 28, 2004

(30) Foreign Application Priority Data

Apr. 28, 2003 (JP) ........................................ 2003-123654

(51) Int. Cl.[7] .............................................. G01R 31/02
(52) U.S. Cl. ..................................... 324/765; 324/158.1
(58) Field of Search ............................. 324/765, 158.1, 324/754, 769, 73.1, 763; 714/719, 724, 720; 327/108, 109, 359–361, 563

(56) References Cited

U.S. PATENT DOCUMENTS 6,737,880 B2 * 5/2004 Samaan et al. .............. 324/765
6,747,470 B2 * 6/2004 Muhtaroglu et al. ........ 324/765

FOREIGN PATENT DOCUMENTS

JP 2001-59855 3/2001

* cited by examiner

Primary Examiner—Michael Tokar
Assistant Examiner—Jimmy Nguyen
(74) Attorney, Agent, or Firm—Staas & Halsey LLP

(57) ABSTRACT

An apparatus measures a voltage fluctuation waveform in a semiconductor integrated circuit having a large number of wiring layers and being operated on a lower voltage without a destructive inspection. For this propose, the apparatus includes a power-source-system waveform converting circuit, disposed close to a functional circuit and in the LSI and operated on a second rated voltage higher than a first rated voltage, for converting the voltage fluctuation waveform of the power source system into an electrical current waveform; a pad for outputting the electric current waveform outside the LSI; and a wiring, arranged in the LSI, for connecting the power-source-system waveform converting circuit and the pad. The apparatus is used to measure a voltage fluctuation waveform near a particular circuit in operation included in, for example, a CMOS LSI.

26 Claims, 8 Drawing Sheets

APPARATUS FOR MEASURING VOLTAGE FLUCTUATION WAVEFORM IN SEMICONDUCTOR INTEGRATED CIRCUIT, AND SEMICONDUCTOR INTEGRATED CIRCUIT HAVING FUNCTION FOR MEASURING VOLTAGE FLUCTUATION WAVEFORM

BACKGROUND OF THE INVENTION

1. Field of the Invention

The present invention relates to a technology to measure a voltage fluctuation waveform near a particular functional circuit in operation, which circuit is included in a semiconductor integrated circuit (e.g., an LSI (Large Scale Integration) serving as a microprocessor) of CMOS (Complementary Metal Oxided Semiconductor).

2. Description of the Related Art

Recent LSI development has gone through increase in consumption electric power in accordance with speeding up the performance, so that the art demands realization of comparison and verification between results of voltage fluctuation waveforms obtained by a simulation performed during wiring design and by actual measurement performed on a final product LSI.

In order to measure a voltage fluctuation waveform immediately near an circuit in operation in an LSI, a conventional method adopts a destructive inspection using FIB (Focused Ion Beam) or a disclosure in Japanese Patent Application KOKAI (Laid-Open) No. 2001-59855 in which an observation terminal is installed to directly measure a power-source voltage and a voltage fluctuation waveform is measured via the observation terminal.

The former destructive inspection method (the former measurement method) treats a wiring layer unit 101 of an LSI 100 with FIB as shown in FIG. 15 and thereby forms a FIB hole 104 that reaches the bottom wiring layer (a power-source wiring) 101-1 located near a measurement-object operating circuit 102 from the top surface (the surface having a pad 103) of the LSI 100. As a result, the bottom wiring layer 101-1 is exposed as a metal exposure layer 104a. After that, the metal exposure layer 104a is irradiated with EB (electron beams) and a voltage fluctuation waveform of the operating circuit 102 is measured on the basis of secondary electrons bounce off the metal exposure layer 104a.

The wiring layer unit 101 of the LSI 100 shown in FIG. 15 includes six metal wiring layers 101-1 through 101-6. X-direction wiring layers 101-1, 101-3 and 101-5 and y-direction wiring layers 101-2, 101-4 and 101-6 are alternatively piled up from the bottom to form the wiring layer unit 101.

On the other hand, the latter method (the latter measurement method) using an observation terminal previously designs a wiring that connects the position (the wiring of the bottom layer) of a measurement-object circuit at the bottom layer of an LSI and the position of the observation terminal (the pad) on the top layer of the LSI. With this design, the voltage close to the measurement-object circuit is directly introduced outside the LSI through the observation terminal and a voltage fluctuation waveform is observed.

The recent LSI development is inclined to increase the number of wiring layers and decrease an operating voltage. An LSI having an increased number of wiring layers makes the former measurement method difficult to expose the bottom layer thereof. For example, the LSI 100 shown in FIG. 15 has six wiring layers. But, in an LSI 200 shown in FIG. 16 having ten wiring layers, it is extremely difficult to expose the desired bottom power-source wiring (the wiring layer 201-1), located on the bottom layer, that supplies the operating circuit 202 by forming FIB hole 204 keeping out signal lines.

In the LSI 200 shown in FIG. 16, a wiring layer unit 201 includes ten metal wiring layers 201-1 through 201-10. Treating the wiring layer unit 201 of the LSI 200 with FIB is to form an FIB hole 204 that reaches the bottom wiring layer (power-source wiring) 201-1 near a measurement-object operating circuit 202 from the top surface (a surface with a pad 203) of the LSI 200. When the LSI 200 has an increased number of wiring layers, the diameter of the opening of the FIB hole 204 at the top layer should be considerably large such that the FIB hole 204 reaches the bottom wiring layer 201-1. Since the FIB hole 204 having a large diameter has high possibility to affect the signal wirings, the FIB hole 204 cannot reach the bottom wiring layer (the power-source wiring) 201-1 and, as described above, it is very difficult to expose the bottom wiring layer 201-1. Therefore, it is difficult for a destructive inspection to measure a voltage fluctuation waveform of the power-source voltage of a LSI with a large number of wiring layers.

Meanwhile, since the current situation where an operating voltage is lowering causes decline of the absolute value of a fluctuation, it is difficult for the latter measurement method to measure an accurate voltage fluctuation waveform of a power-source voltage. Especially, if an increased number of wiring layers prolongs the distance between the position of a power-source wiring on the bottom layer and the observation terminal (the pad) on the top layer, the measurement for an accurate voltage fluctuation amount becomes further difficult.

As described above, an LSI having a large number of wiring layers and being operated on a lower voltage makes the conventional measurement methods difficult to measure a power-source voltage fluctuation of such a LSI so that the demand for comparison and verification between the results of voltage fluctuation waveforms obtained by a simulation performed as wiring design and by actual measurement performed on a final product LSI cannot fulfilled.

SUMMARY OF THE INVENTION

The foregoing problems in view, the object of the present invention is to measure an accurate voltage fluctuation waveform of a power-source voltage in a semiconductor integrated circuit, having a large number of wiring layers and being operated on a low voltage, without treating with FIB, i.e., by a non-destructive inspection method.

To attain the above object, as the first generic feature of the present invention, there is provided an apparatus for measuring a voltage fluctuation waveform of a power source system of a functional circuit operated on a first rated voltage in a semiconductor integrated circuit, comprising: a power-source-system waveform converting circuit, disposed close to the functional circuit and in the semiconductor integrated circuit and operated on a second rated voltage higher than the first rated voltage, for converting the voltage fluctuation waveform of the power source system into an electrical current waveform; a power-source-system fluctuation waveform output terminal for outputting the electric current waveform obtained by the power-source-system waveform converting circuit outside the semiconductor integrated circuit; and a power-source-system fluctuation waveform output wiring, arranged in the semiconductor integrated circuit, for connecting the power-source-system waveform converting circuit and the power-source-system fluctuation waveform output terminal.

As a preferable feature, when a grounded system of the power-source-system waveform converting circuit is disconnected from a grounded system of the functional circuit, the power-source-system waveform converting circuit may convert a potential fluctuation waveform relative to a ground level of an external voltage source connected to the power source system of the functional circuit, which potential fluctuation waveform is in the form of the voltage fluctuation waveform of the power source system, into the electric current waveform. As another preferable feature, when a grounded system of the power-source-system waveform converting circuit is connected to a grounded system of the functional circuit, the power-source-system waveform converting circuit may convert a potential fluctuation waveform of a potential between the power source system and the grounded system of the functional circuit, which potential fluctuation waveform is in the form of the voltage fluctuation waveform of the power source system, into the electric current waveform.

As a second generic feature, there is provided an apparatus for measuring a voltage fluctuation waveform of a grounded system of a functional circuit operated on a first rated voltage in a semiconductor integrated circuit, comprising: a grounded-system waveform converting circuit, disposed close to the functional circuit and in the semiconductor integrated circuit and operated on a third rated voltage higher than the first rated voltage, for converting the voltage fluctuation waveform of the grounded system into an electrical current waveform; a grounded-system fluctuation waveform output terminal for outputting the electric current waveform obtained by the grounded-system fluctuation waveform converting circuit outside the semiconductor integrated circuit; and a grounded-system fluctuation waveform output wiring, arranged in the semiconductor integrated circuit, for connecting the grounded-system waveform converting circuit and the grounded-system fluctuation waveform output terminal.

As a third generic feature, there is provided an apparatus for measuring a voltage fluctuation waveform of a power-source system and a grounded system of a functional circuit operated on a first rated voltage in a semiconductor integrated circuit comprising: the power-source-system waveform converting circuit; the grounded-system waveform converting circuit; the power-source-system fluctuation waveform output terminal; the grounded-system fluctuation waveform output terminal; the power-source-system fluctuation waveform output wiring; and the grounded-system fluctuation waveform output wiring.

As a fourth generic feature, there is provided a semiconductor integrated circuit including a functional circuit, being operated on a first rated voltage, and having a function for measuring a voltage fluctuation waveform of a power source system of the functional circuit, comprising: the power-source-system waveform converting circuit; the power-source-system fluctuation waveform output terminal; and the power-source-system fluctuation waveform output wiring.

As a fifth generic feature, there is provided a semiconductor integrated circuit including a functional circuit, being operated on a first rated voltage, and having a function for measuring a voltage fluctuation waveform of a grounded system of the functional circuit, comprising: the grounded-system waveform converting circuit; the grounded-system fluctuation waveform output terminal; and the grounded-system fluctuation waveform output wiring.

As a sixth generic feature, there is provided a semiconductor integrated circuit including a functional circuit, being operated on a first rated voltage, and having a function for measuring a voltage fluctuation waveform of a power source system of the functional circuit and a voltage fluctuation waveform of a grounded system of the functional circuit, comprising: the power-source-system waveform converting circuit; the grounded-system waveform converting circuit; the power-source-system fluctuation waveform output terminal; the grounded-system fluctuation waveform output terminal; the power-source-system fluctuation waveform output wiring; and the grounded-system fluctuation waveform output wiring.

The above apparatus for measuring a voltage fluctuation waveform of a voltage in a semiconductor integrated circuit and the semiconductor integrated circuit having a function for a voltage fluctuation waveform ensure the following advantages:

(1) Since voltage fluctuation waveforms of the power-source system and/or the grounded system of a functional circuit operated on a low voltage are converted into electric current waveforms near a desired observation point and then the electric current waveforms are output outside the semiconductor integrated circuit, it is possible to measure an accurate voltage fluctuation waveform without treating the circuit with FIB or the like, i.e., by a non-destructive inspection that is not accompanying destruction of the circuit even if the semiconductor integrated circuit has a large number of wiring layers and is operated on a lower voltage. Whereupon it is possible to surly satisfy the request for comparison and verification between results of voltage fluctuation waveforms obtained by a simulation performed as wiring design and by actual measurement performed on a final product LSI.

(2) When the grounded system of the power-source-system waveform converting circuit is disconnected from the grounded system of the functional circuit, a potential fluctuation waveform relative to a ground level of an external voltage source connected to the power source system of the functional circuit is converted into an electric current waveform and the electric current waveform is output outside the semiconductor integrated circuit so that it is possible to accurately measure the potential fluctuation waveform.

(3) When the grounded system of the power-source-system waveform converting circuit is connected to the grounded system of the functional circuit, a potential fluctuation waveform of a potential between the power source system and the grounded system of the functional circuit is converted into an electric current waveform and the electric current waveform is output outside the semiconductor integrated circuit so that it is possible to accurately measure the potential fluctuation waveform.

(4) Since the power-source-system fluctuation waveform output terminal and the grounded-system fluctuation waveform output terminal are connected to power source systems, which respectively supply the second rated voltage and the third rated voltage that are higher than the first rated voltage and which are disposed outside the semiconductor integrated circuit, through resistor elements, fluctuation waveforms (electric current waveforms) can be enlarged by an appropriate resistor-divider ratio and can be measured. Additionally, adjustment to resistances of the resistor elements can adjust sensitivity to conversion to an electric current whereupon the present invention can be effectively applied to measurement for a voltage fluctuation waveform even if semiconductor integrated circuit can be operated on a lower voltage as development generation alternates whereby the absolute value of a fluctuation amounts becomes smaller.

Other objects and further features of the present invention will be apparent from the following detailed description when read in conjunction with the accompanying drawings.

DESCRIPTION OF THE PREFERRED EMBODIMENT

A preferred embodiment of the present invention will now be described with reference to the accompanying drawings.

Figure 1:
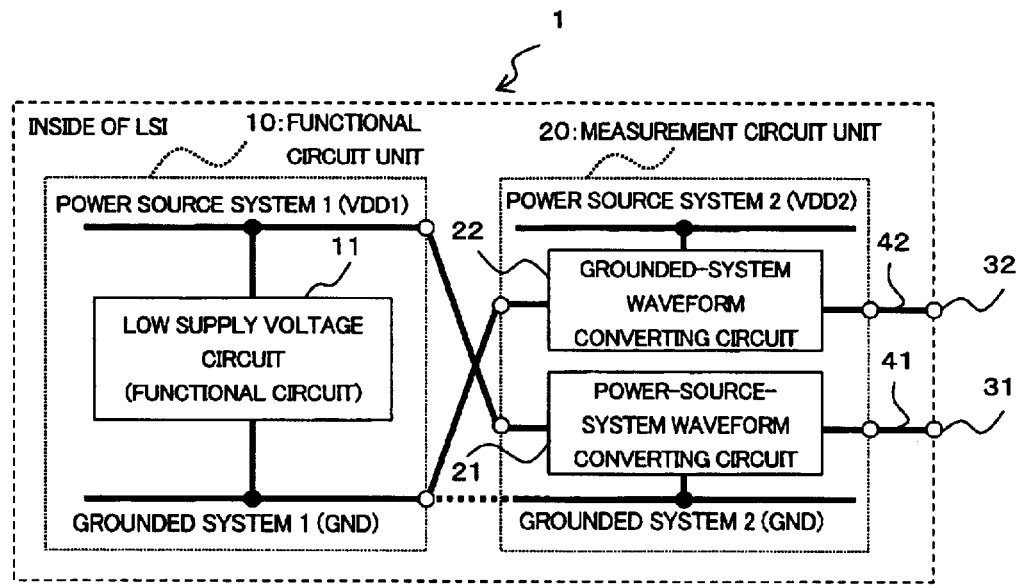
FIG. 1 is a block diagram schematically showing an apparatus for measuring a voltage fluctuation waveform in a semiconductor integrated circuit and a semiconductor integrated circuit having a function for measuring a voltage fluctuation waveform of the present invention.

(1) Fundamentals of the present invention:

FIG. 1 schematically showing an apparatus for measuring a voltage fluctuation waveform in a semiconductor integrated circuit and a semiconductor integrated circuit having a function for measuring a voltage fluctuation waveform of the present invention. An LSI (semiconductor integrated circuit) 1 shown in FIG. 1 includes a functional circuit unit 10 to realize the original function of the LSI 1 and a measurement circuit unit 20 to measure a voltage fluctuation waveform (voltage fluctuation waveforms of the power source system and the grounded system of a later-described functional circuit 11) in the functional circuit unit 10.

The functional circuit unit 10 includes the low supply voltage circuit (functional circuit) 11 operated on a first rated voltage (e.g., 1.0 V). The functional circuit 11 is operated by being connected to a grounded system 1 (GND=0 V) and to a power-source system 1 (VDD1=1.0 V).

The measurement circuit unit 20 includes a power-source-system waveform converting circuit 21 and a grounded-system waveform converting circuit 22. In order to operate these converting circuits 21 and 22, a grounded system 2 (GND=0 V) and to a power-source system 2 (VDD2=1.0 V) are arranged in the measurement circuit unit 20. The grounded system 2 may be connected to or disconnected from the above grounded system 1 for the functional circuit 11, as described below. Connection and disconnection between these grounded systems can obtain different results (to be described later). Here, the power-source system 2 is a different system from the above power-source system 1 of the functional circuit 11, and, for example, the power-source system for the I/O circuit of the LSI 1 can be used as the power-source system 2 as described below with reference to FIG. 14.

The power-source-system waveform converting circuit 21 is disposed close to the functional circuit 11 and is connected to the grounded system 2 and the power-source system 1 of the functional circuit 11. The power-source-system waveform converting circuit 21 is operated on a second rated voltage (in this example, 1.8 V) higher than the first rated voltage (VDD1=1.0 V) and converts the voltage fluctuation waveform of the power-source system 1 for the functional circuit 11 into an electric current waveform that is to be output outside the LSI 1.

The grounded-system waveform converting circuit 22 is disposed close to the functional circuit 11 and is connected to the above power-source system 2 and the grounded system 1 of the functional circuit 11. The grounded-system waveform converting circuit 22 is operated on a third rated voltage (in the illustrated example, 1.8 V) higher than the first rated voltage (VDD1=1.0 V) and converts the voltage fluctuation waveform of the grounded system 1 for the functional circuit 11 into an electric current waveform that is to be output outside the LSI 1.

The LSI 1 of this embodiment further includes, as shown in FIG. 1 (FIG. 13), a power-source-system fluctuation waveform output terminal (external connection pad) 31 to output an electric current waveform obtained by the powersource-system waveform converting circuit 21 outside the LSI 1 and a power-source-system fluctuation waveform output wiring 41 arranged in the LSI 1 to connect the pad 31 and the power-source-system waveform converting circuit 21. The LSI 1 includes also a grounded-system fluctuation waveform output terminal (external connection pad) 32 to output an electric current waveform obtained by the grounded-system waveform converting circuit 22 outside the LSI 1 and a grounded-system fluctuation waveform output wiring 42 arranged in the LSI 1 to connect the pad 32 and the grounded-system waveform converting circuit 22.

Figure 2:
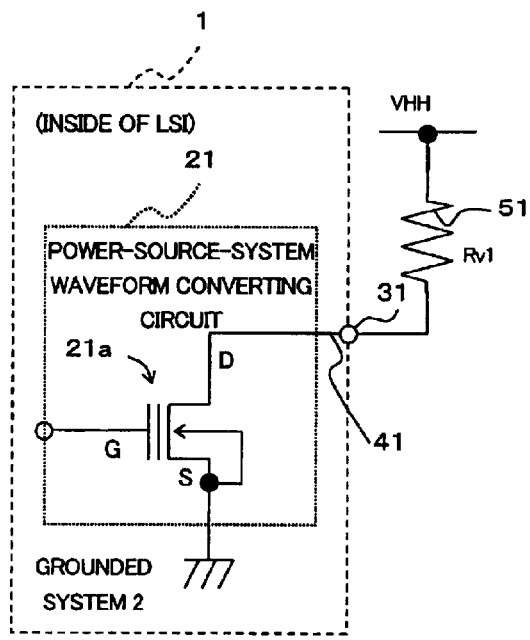
FIG. 2 is a circuit diagram showing a power-source-system waveform converting circuit according to a first embodiment.
Figure 3:
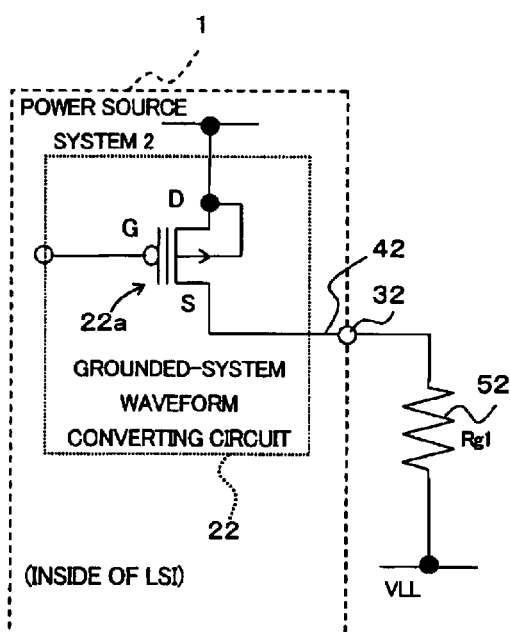
FIG. 3 is a circuit diagram showing a grounded-system waveform converting circuit of the first embodiment.

(2) Concrete configuration of a first embodiment:

Next, a concrete configuration of the LSI 1 (the power-source-system waveform converting circuit 21 and the grounded-system waveform converting circuit 22) having a function for measuring a voltage fluctuation waveform according to a first embodiment will now be described with reference to FIGS. 2–4. Here, FIG. 2 is a circuit diagram of the power-source-system waveform converting circuit 21 according to the first embodiment; FIG. 3 is a circuit diagram of the grounded-system waveform converting circuit 22 according to the first embodiment; and FIG. 4 is a circuit diagram showing an apparatus for measuring a voltage fluctuation waveform and a semiconductor integrated circuit (the LSI 1) having a function for measuring a voltage fluctuation waveform of the first embodiment.

The converting circuits 21 and 22 utilize MOSFETs (metal-oxide-semiconductor field effect transistors) that are operated on a higher voltage (1.8 V) than a voltage for a MOSFET used in the functional circuit unit 10.

Figure 4:
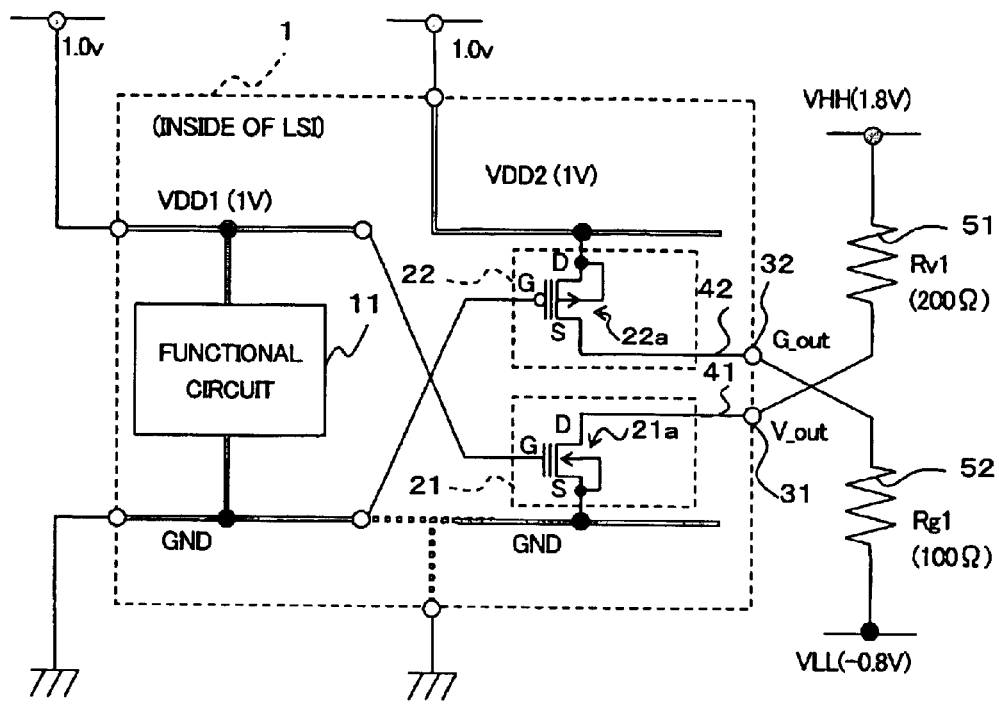
FIG. 4 is a circuit diagram showing an apparatus for measuring a voltage fluctuation waveform in a semiconductor integrated circuit and a semiconductor integrated circuit having a function for measuring a voltage fluctuation waveform of the first embodiment.

As shown in FIGS. 2 and 4, the power-source-system waveform converting circuit 21 of the first embodiment is in the form of an n-channel MOSFET 21a having the gate terminal G connected to the power-source system 1 (VDD1= 1.0V) of the functional circuit 11, the source terminal S connected to the grounded system 2 (GND) and the drain terminal D connected to a voltage source system (VHH=1.8 V), which supplies the second rated voltage and which is arranged outside the LSI 1, through the wiring 41, the pad (a V_out terminal) 31 and a first resistor 51 (having a resistance Rv1=200 Ω). The first resistor 51 is arranged outside the LSI 1 and is disposed between the pad 31 and the external power-source system VHH.

At that time, when the grounded system 2 of the power-source-system waveform converting circuit 21 is disconnected from the grounded system 1 of the functional circuit 11, the power-source-system waveform converting circuit 21 (the n-channel MOSFET 21a) converts a potential fluctuation waveform of a potential relative to the ground level of an external voltage source connected to the power-source system 1 of the functional circuit 11, which waveform is in the form of a voltage fluctuation waveform of the power-source system 1, into an electrical current waveform and outputs the electric current waveform outside the LSI 1. Thereby, voltage fluctuations of the power-source system 1 of the functional circuit 11 and the grounded system 1 of the functional circuit 11 are independently converted and measured respectively by the power-source system waveform converting circuit 21 and the grounded-system waveform converting circuit 22.

On the other hand, when the grounded system 2 of the power-source-system waveform converting circuit 21 is connected to the grounded system 1 of the functional circuit 11, the power-source-system waveform converting circuit 21 (the n-channel MOSFET 21a) converts a potential fluctuation waveform of a potential between the power-source system 1 and the grounded system 1 of the functional circuit 11, which waveform is in the form of a voltage fluctuation waveform, into an electric current waveform and outputs the electric current waveform outside the LSI 1. In this case, the grounded-system waveform converting circuit 22 is not used for conversion and measurement while only the power-source-system waveform converting circuit 21 is used.

Further, the grounded system 2 (GND) of the power-source-system waveform converting circuit 21 (the n-channel MOSFET 21a) can be configured to be different from the grounded system 1 (GND) of the functional circuit 11 and the power-source system for the I/O circuit of the LSI 1 can be used as the grounded system 2 (GND).

As shown in FIGS. 3 and 4, the grounded-system waveform converting circuit 22 is in the form of a single p-channel MOSFET 22a having the gate terminal G connected to the grounded system 1 (GND) of the functional circuit 11, the drain terminal D is connected to the power-source system 2 (VDD2=1.0 V) and the source terminal S connected to a power source, which supplies the third rated voltage (a negative potential VLL=–0.8 V) and which is arranged outside the LSI 1, through the wiring 42, the pad 32 (a G_out terminal) and a second resistor 52 (having a resistance Rg1=100 Ω). The second resistor 52 is arranged outside the LSI 1 and is disposed between the pad 32 and the external power-source system VLL.

As shown in FIG. 4, when the power-source system 2 of the grounded-system waveform converting circuit 22 is disconnected from the power-source system 1 of the functional circuit 11, the grounded-system waveform converting circuit 22 (the p-channel MOSFET 22a) converts a potential fluctuation waveform of a potential relative to the power source level of an external voltage source connected to the functional circuit 11, which waveform is in the form of a voltage fluctuation waveform, into an electric current waveform and outputs the electric current waveform outside the LSI 1. Thereby, voltage fluctuations of the power-source system 1 of the functional circuit 11 and the grounded system 1 of the functional circuit 11 can be independently converted and measured respectively by the power-source-system waveform converting circuit 21 and grounded-system wave form converting circuit 22.

Conversely, when the power-source system 2 of the grounded-system waveform converting circuit 22 is connected to the power-source system 1 of the functional circuit 11, the grounded-system waveform converting circuit 22 (the p-channel MOSFET 22a) converts a potential fluctuation waveform of a potential between the power-source system 1 and the grounded system 1 of the functional circuit 11, which waveform is in the form of a voltage fluctuation waveform, into an electric current waveform and outputs the electric current waveform outside the LSI 1. In this case, the power-source-system waveform converting circuit 21 is not used for conversion and measurement while only the grounded-system waveform converting circuit 22 is used.

Further, as shown in FIG. 4, the power-source system 2 (VDD2=1.0 V) of the grounded-system waveform converting circuit 22 (the p-channel MOSFET 22a) is a different system from the power-source system 1 (VDD1=1.0 V) of the functional circuit 11. The power-source system 1 of the functional circuit 11 is a general system while a power-source system for the I/O circuit of the LSI 1 can be used as the power-source system 2 (VDD2=1.0 V) as described later with reference to FIG. 14.

Hereinafter is description of validity of measurement for a voltage fluctuation waveform using the measurement apparatus having the above configuration in view of the conversion fundamental, a method for measurement circuit design, measurement simulation and verification simulation.

(3) Measurement fundamental (conversion fundamental):

The measurement fundamental performed on the circuit shown in FIG. 4 will now be described with reference to FIG. 5, which shows a graph of Vgs-Ids (Vgs: gate-source voltage; and Ids: drain electric current) characteristic curve of the n-channel MOSFET 21a serving as the power-source-system waveform converting circuit 21 of the first embodiment.

In the measurement apparatus shown in FIG. 4, a rated voltage (the first rated voltage) for the MOSFET (riot shown) of the functional circuit 11 is 1.0 V (VDD1), a rated voltage (the second rated voltage) for the n-channel MOSFET 21a of the converting circuit 21 is 1.8 V (VDD2) and the n-channel MOSFET 21a of the converting circuit 21 has a working range of Vds (the drain-source voltage)=Vgs (gate-source voltage)=0–1.8 V (VHH).

Figure 5:
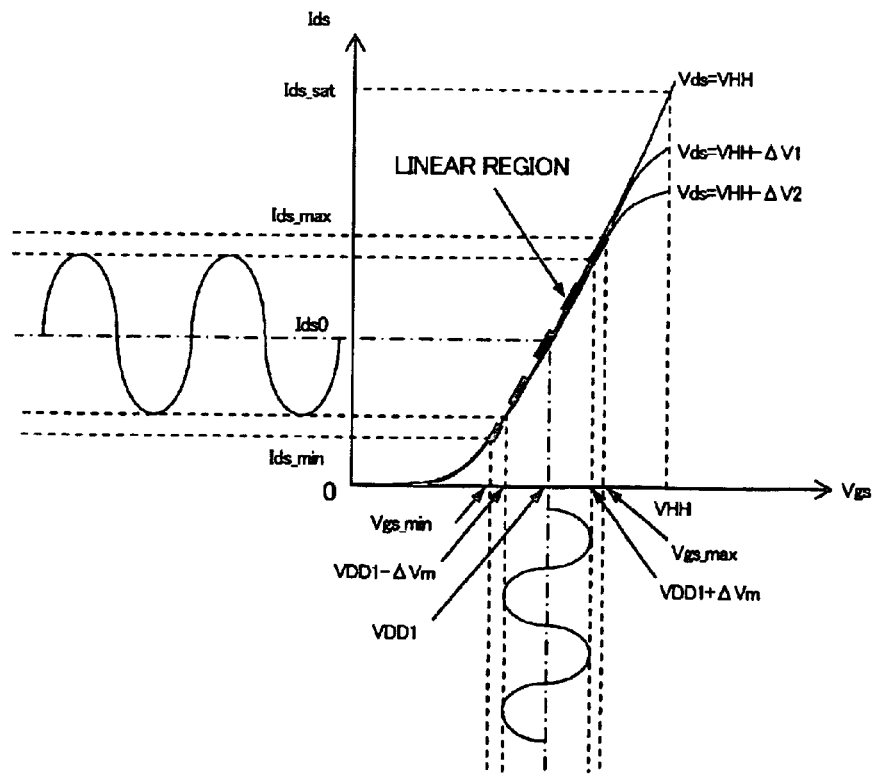
FIG. 5 is a graph showing Vgs-Ids characteristic curve of an n-channel MOSFET serving as the power-source-system waveform converting circuit of the first embodiment.

Plotting of the Vgs-Ids characteristic of the n-channel MOSFET 21a forms a characteristic curve shown in FIG. 5. The characteristic curve of the drain electric current value Ids linearly extends after the gate-source voltage value Vgs excesses a certain value (Vgs_min). When the drain-source voltage value Vds is equal to VHH (Vds=VHH), the drain electric current value Ids reaches the value Ids_sat. Conversely, if the drain-source voltage value Vds is lower than VHH (Vds<VHH), the drain electric value Ids is saturated before reaches the value Ids_sat. However, Vds lower than VHH (Vds<VHH) forms the same characteristic curve as the case of Vds=VHH before the saturation point. Therefore, when the drain-source voltage value Vds is lower than VHH (Vds<VHH), the Vgs-Ids characteristic curve of the n-channel MOSFET 21a serving as the converting circuit 21 has the identical linear region (liner portion), irrespective of values of Vds, at the range of the drain electric current value Ids between the certain value and the saturation point.

Here, as shown in FIG. 5, the gate-source voltage value Vgs at the start and the end of linear extension are respectively regarded as the value Vgs_min and the value Vgs_max, and a variable ±ΔVm with respect to the VDD1 (the voltage value of the power-source system 1) is defined within the range between the Vgs_min and the Vgs_max. When the gate-source voltage value Vgs is varied in the range of VDD1 ±ΔVm, the fluctuation of the gate-source value Vgs is mapped over the drain electric current value Ids without distortion.

(4) Measurement simulation:

Subsequently, referring to FIGS. 6–11, a measurement simulation performed by the converting circuit 21 and 22 of the first embodiment will be now described.

Figure 6:
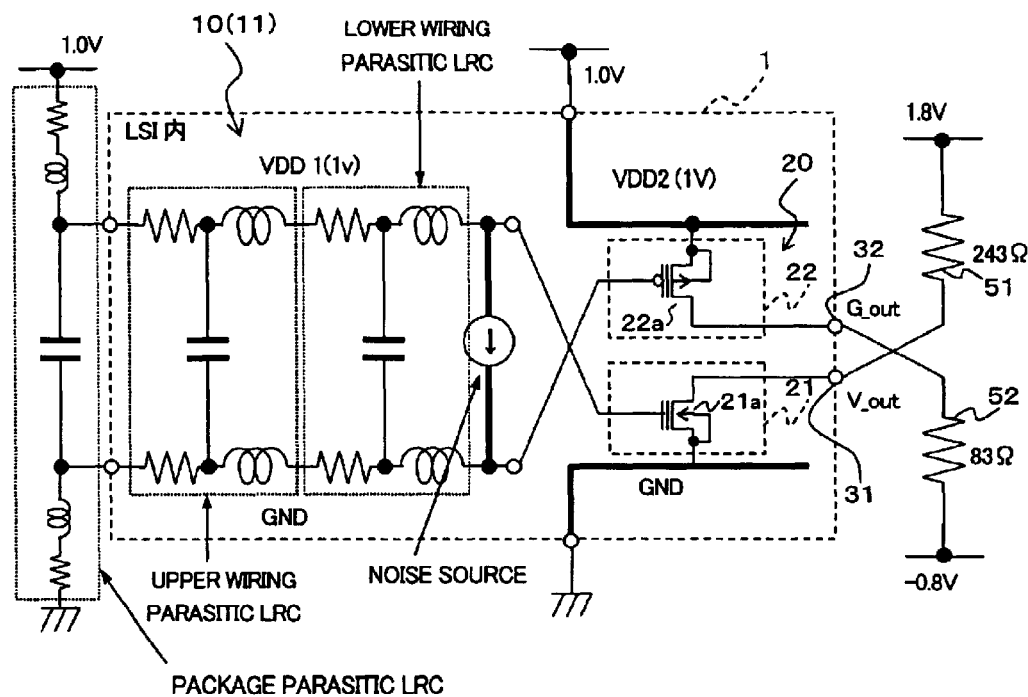
FIG. 6 is a circuit diagram showing a circuit to be subjected to simulation (an equivalent circuit of an LSI having a function for measuring a voltage fluctuation waveform of the first embodiment)

FIG. 6 shows a circuit diagram of a circuit (an equivalent circuit of the LSI having a function for measuring a voltage fluctuation waveform according to this embodiment) that is to be subjected to a simulation. The simulation-object circuit shown in FIG. 6 includes the measurement circuit unit 20 (the converting circuits 21 and 22) and the remaining portion (the functional circuit unit 10 and other units) except the converting circuits 21 and 22, which portion is in the form of an equivalent circuits (a lower wiring parasitic LRC, an upper wiring parasitic LRC and a package parasitic LRC). A noise source is disposed between the power-source system 1 (VDD1) and the grounded system 1 (GND) of the functional circuit unit 10. The noise source is an electric current source and provides a voltage applied to the power-source wiring with a noise waveform by setting a consumption electric current waveform during the operation of the circuit (the LSI 1) and the measurement simulation is performed on the noise waveform by the converting circuits 21 and 22.

In the simulation-object circuit shown in FIG. 6, the grounded system 1 (GND) of the functional circuit unit 10 is disconnected from the grounded system 2 (GND) of the measurement circuit unit 20 and the resistances Rv1 and Rg1 of the first resistor 51 and the second resistor 52 are 243 Ω and 83 Ω, respectively. The inductance of a wiring close to the noise source is set to be relatively large so as to easily generate dI/dt noise.

Figure 7:
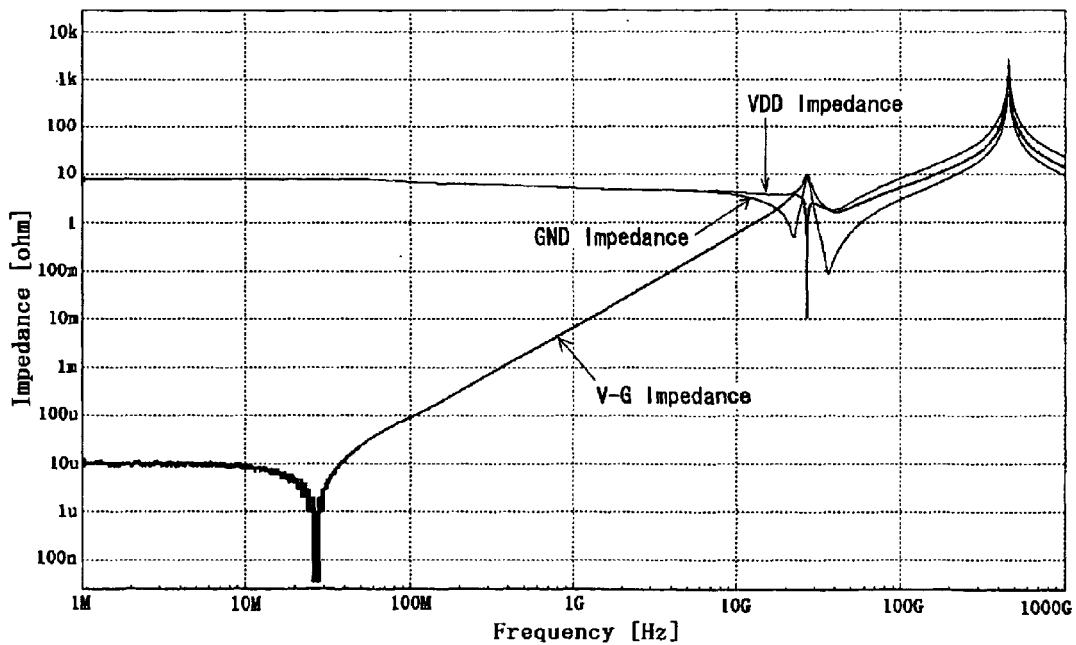
FIG. 7 is a graph showing characteristics between VDD/GND-impedance and frequency of the circuit shown in FIG. 6.

FIG. 7 is a graph showing characteristics between VDD/GND-impedance and frequency of the circuit shown in FIG. 6. FIG. 7 shows impedance curves (VDD Impedance and GND Impedance) seen from the both ends of the noise source. As shown in FIG. 7, since each of the wirings of the VDD1 and the GND has impedance of 8 Ω at a low frequency region, the impedance between the VDD1 and the GND (V-G Impedance) is nearly 0 Ω. The V-G impedance (between the VDD1 and the GND) starts increasing around 30 MHz and has resonance points around 20 GHz and 400 GHz. The power source noise requires consideration for noise frequency components that are multiples of the clock frequency so that realization of performance of the converting circuits 21 and 22 requires a higher frequency region than the clock frequency.

Figure 8:
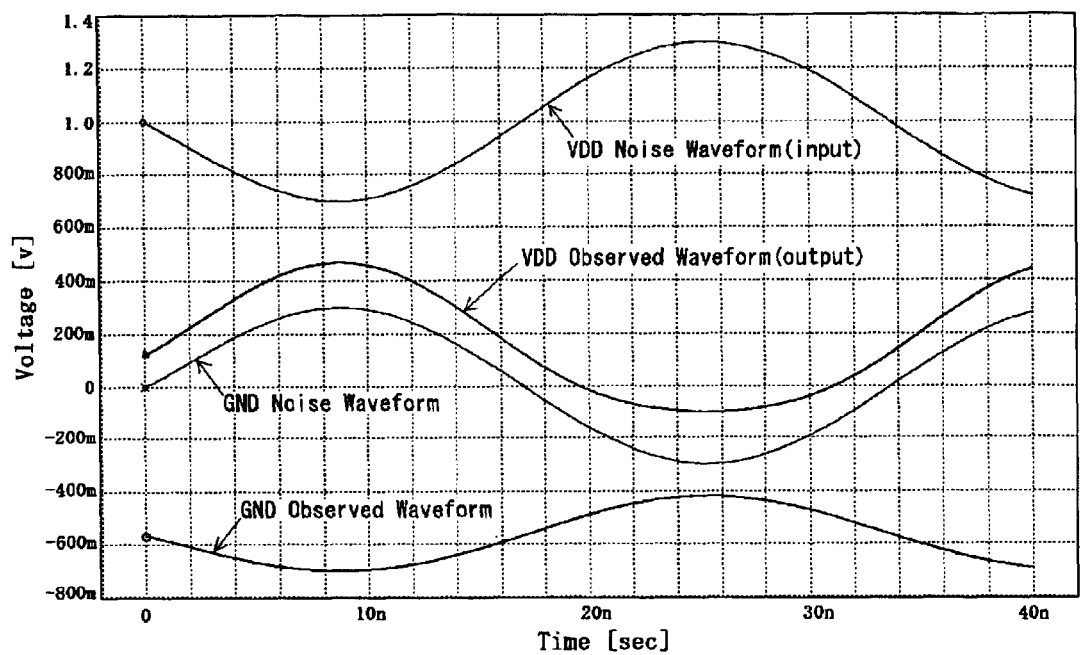
FIG. 8 is a graph showing results of waveform observation simulation of the circuit shown in FIG. 6 relative to 30 MHz sine-wave noise.

FIG. 8 is a graph showing results of a waveform observation simulation performed on the circuit shown in FIG. 6 relative to 30 MHz sine-wave noise. FIG. 8 shows waveforms (VDD Noise Waveform and GND Noise Waveform) obtained when a sine-wave noise having an amplitude of 300 mV and a frequency of 30 MHz is imposed on each of the VDD1 (1V) and the GND and waveforms (VDD Observed Waveform and GND Observed Waveform) of outputs respectively from the converting circuits 21 and 22. The results of the measurement simulation are obtained by measuring the voltages at the V_out terminal and the G_out terminal. The output waveforms in FIG. 8 have some distortion because VDD1±300 mV is slightly outside the range between the Vgs_max and the Vgs_min in FIG. 5 and linearity is therefore not adequately ensured.

Figure 9:
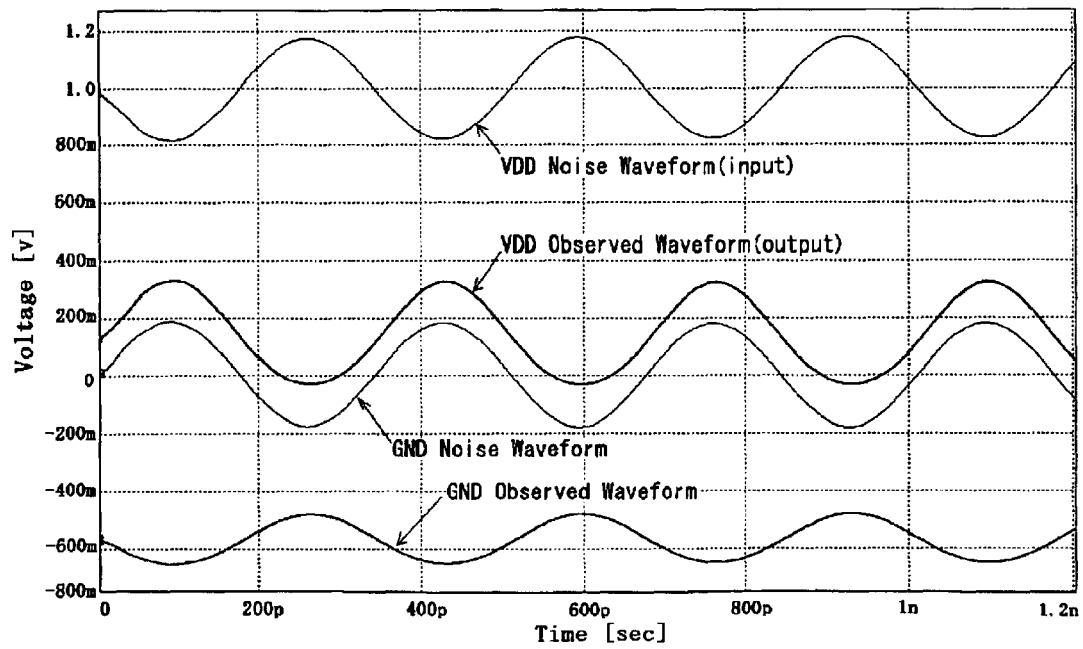
FIG. 9 is a graph showing results of waveform observation simulation of the circuit shown in FIG. 6 relative to 3 GHz sine-wave noise.

FIG. 9 is a graph showing results of waveform observation simulation of the circuit shown in FIG. 6 relative to 3 GHz sine-wave noise. FIG. 9 shows waveforms (VDD Noise Waveform and GND Noise Waveform) obtained when a sine-wave noise having an amplitude of 180 mV and a frequency of 3 GHz is imposed on each of the VDD1 (1V) and the GND and waveforms (VDD observed waveform and GND observed waveform) of outputs respectively from the converting circuit 21 and 22. Also here, the results of the measurement simulation are obtained by measuring the voltages at the V_out terminal and the G_out terminal. The waveforms output as results of the measurement simulation are favorable in FIG. 9.

Figure 10:
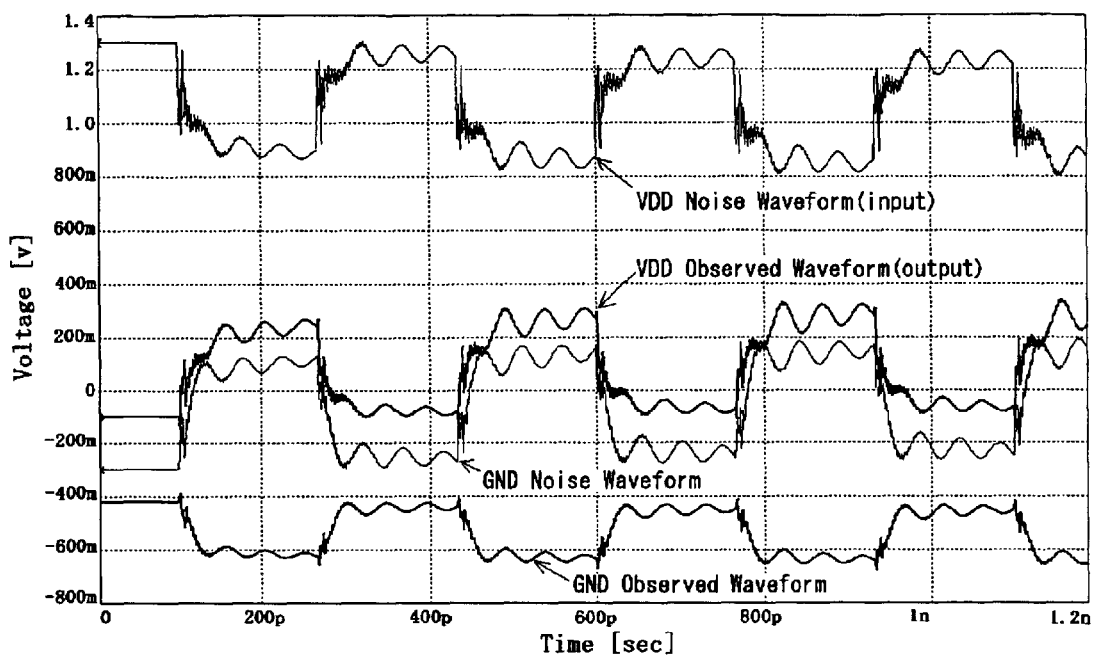
FIG. 10 is a graph showing results of waveform observation simulation of the circuit shown in FIG. 6 relative to 3 GHz pulse noise.

FIG. 10 is a graph showing results of waveform observation simulation of the circuit shown in FIG. 6 relative to 3 GHz pulse noise. FIG. 10 shows waveforms (VDD Noise Waveform and GND Noise Waveform) obtained when a pulse noise having an amplitude of 300 mV and a frequency of 3 GHz is imposed on each of the VDD1 (1V) and the GND and waveforms (VDD Observed Waveform and GND Observed Waveform) of outputs respectively from the converting circuit 21 and 22. Also here, the results of the measurement simulation are obtained by measuring the voltages at the V_out terminal and the G_out terminal. The pulse waveform can be considered as a complex including components in a wide frequency region. The converting circuits 21 and 22 cannot follow sensitive fluctuation waveforms corresponding to the hasty variation when rising and falling but other output waveforms are favorable. Since the simulation-object circuit in FIG. 6 has circuit parameters set so as to sensitively fluctuate responsive to hasty rising and falling, the graph FIG. 10 reveals the presence of the limit of the performance of the converting circuits 21 and 22.

Since the measurement simulations shown in FIGS. 6–10 uses the converting circuit 22 for the grounded system (GND) in the form of the p-channel MOSFET 22a, the output electric current (0.4–0.6 mA) of the p-channel MOSFET 22a is smaller than that (approximately 1.0 mA) of the n-channel MOSFET 21a. In this embodiment, since the simulations are carried out assuming that the n-channel MOSFET 21a and the p-channel MOSFET 22a are same in size (have the same gate width), the measurement result for the grounded system is approximately half of the measurement result for the power source system. For this reason, the gate width W of the p-channel MOSFET 22a serving as the converting circuit 22 is preferably set approximate twice the gate width W of the n-channel MOSFET 21a serving as the converting circuit 21.

Figure 11:
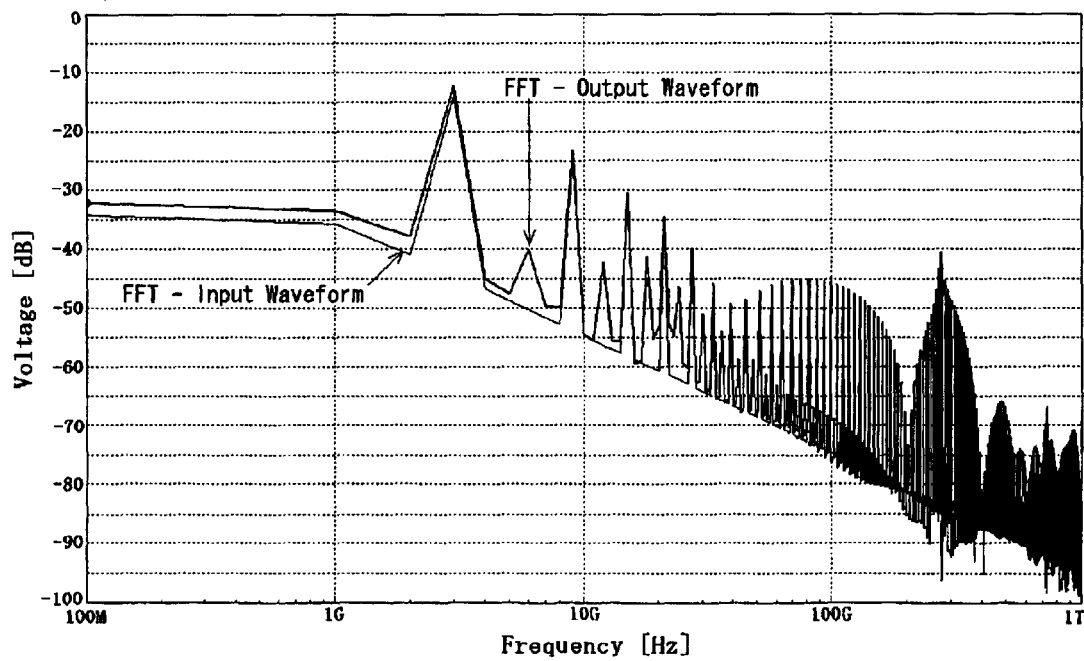
FIG. 11 is a graph showing results of Fast Fourier Transform performed on an input waveform and an output waveform shown in FIG. 10.

(5) Verification simulation:

FIG. 11 is a graph showing results of Fast Fourier Transform performed on an input waveform and an output (a measured) waveform shown in FIG. 10. As shown in FIG. 11, the input waveform (FFT-Input Waveform) includes a frequency component of an odd multiple of that of the pulse frequency while the output waveform (FFT-Output Waveform) includes a frequency component, identical in strength to the input waveform, having an odd multiple of that of the pulse frequency and a frequency component, weaker than the input waveform, having an even multiple of that of the pulse frequency. The even-multiple frequency component causes distortion of the waveform but is weaker than the odd-multiple component. As a result, the output waveform is mapped over without a major distortion.

(6) Concrete application example:

As described above, the use of MOSFETs 21a and 22a operated on higher voltages than that for a MOSFET of the functional circuit unit 10 can output a voltage fluctuation waveform of the functional circuit unit 10 outside the LSI 1.

Figure 12:
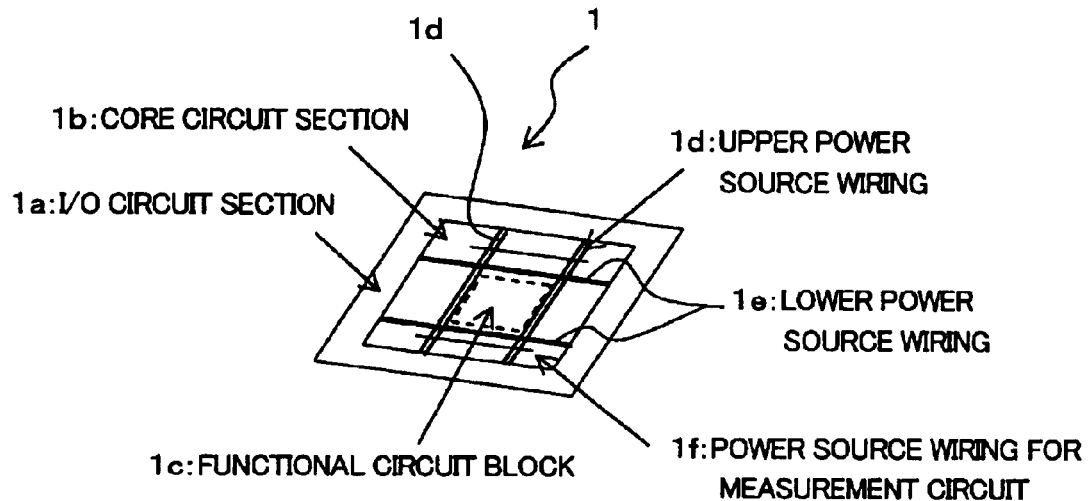
FIG. 12 is a perspective view schematically illustrating an LSI (specifically, an LSI in which a MOSFET for an I/O circuit section is operated on a higher voltage that of a MOSFET for a core circuit section) adapted to a method for measuring a voltage fluctuation waveform of the present invention.
Figure 13:
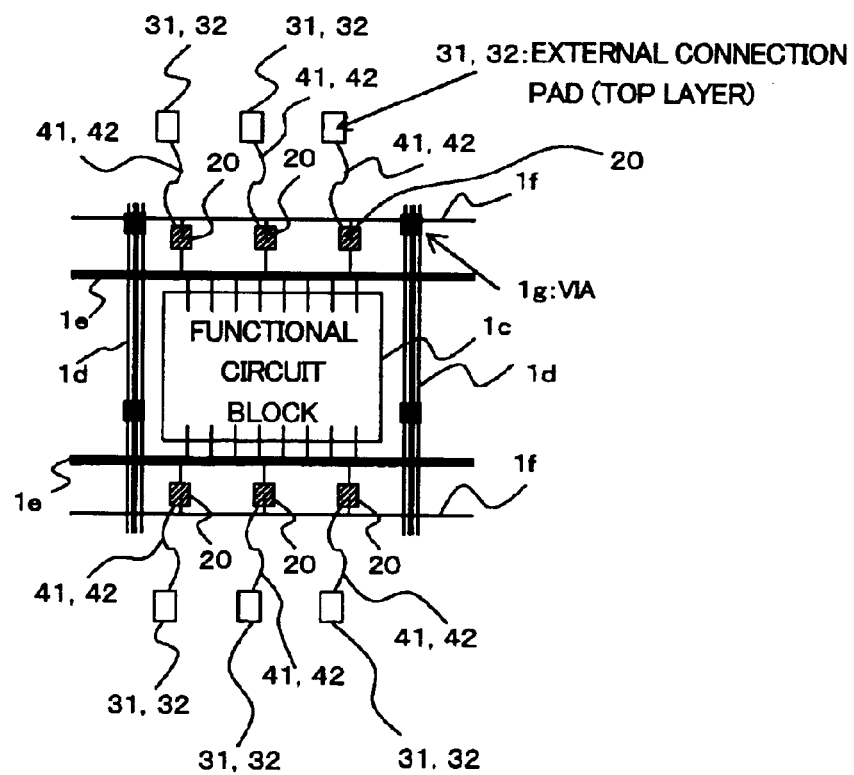
FIG. 13 is a plain view schematically showing an enlargement of the main part of the LSI shown in FIG. 12.
Figure 14:
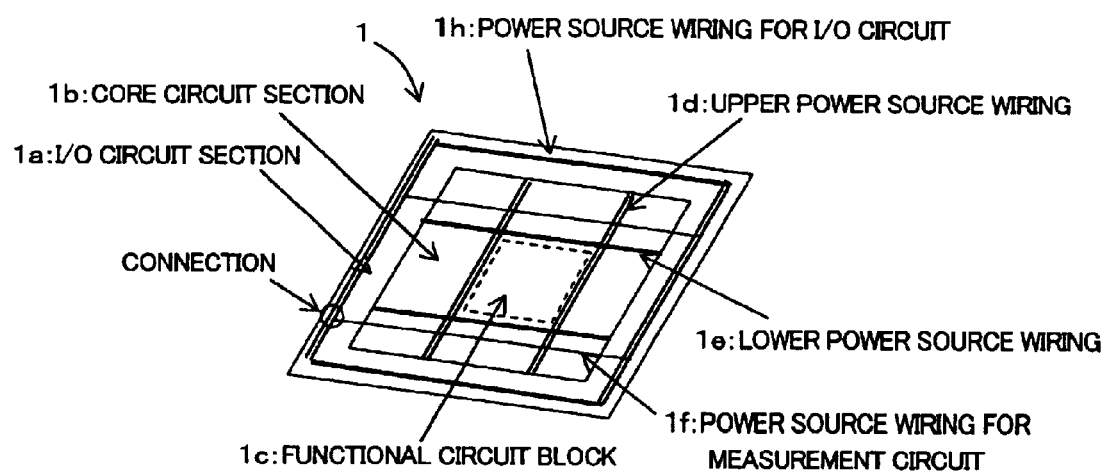
FIG. 14 is a perspective view schematically showing an example of the LSI of FIGS. 12 and 13 in which a power source system is shared by an I/O circuit section and a measurement circuit unit.
Figure 15:
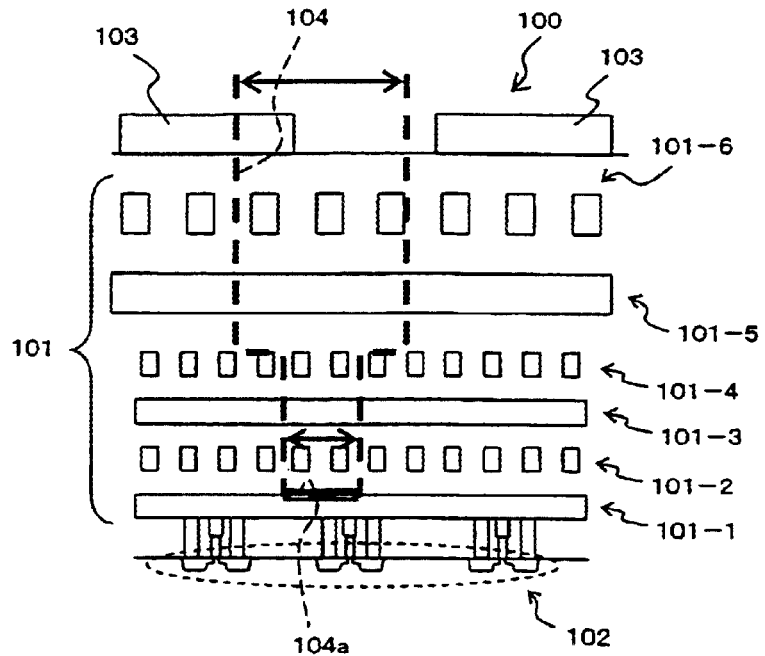
FIG. 15 is a sectional view schematically showing a method (a destructive inspection method) for measuring a power-source voltage waveform by destructive inspection using FIB performed on an LSI with six wiring layers.
Figure 16:
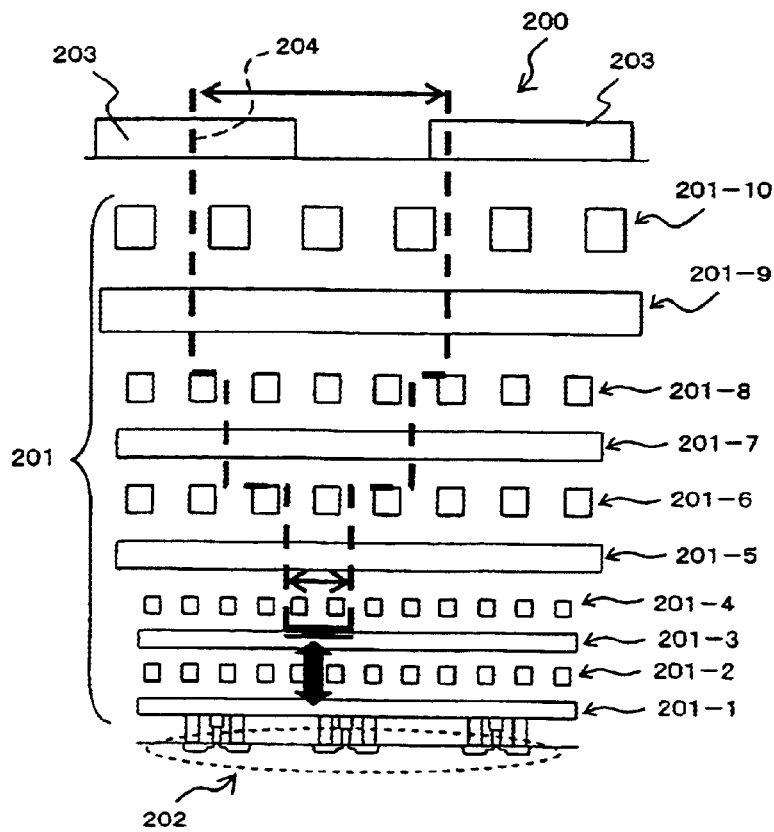
FIG. 16 is a sectional view schematically showing a method (a destructive inspection method) for measuring a power-source voltage waveform by destructive inspection using FIB performed on an LSI with ten wiring layers.

In the first embodiment, the MOSFET for the functional circuit unit 10 and the MOSFETs 21a and 22a included in the measurement circuit unit 20 respectively correspond to a MOSFET for a core circuit section 1b (see FIGS. 12–14) and MOSFETs for an I/O circuit section 1a (see FIGS. 12–14). The circuit sections 1a and 1c are normally included in a general microprocessor LSI. As shown in FIGS. 12 and 13, the present invention can therefore apply to such LSI 1 without affecting on process technology and circuit technology.

Further, as shown in FIG. 14, since the power source system (a power source wiring 1h for an I/O circuit) for the I/O circuit section 1a is shared by the measurement circuit unit 20 as a power source wiring If for measurement circuit, the LSI 1 need not to be equipped with a terminal to supply power for the measurement circuit unit 20 (the converting circuit 22) from a special external power source.

If an LSI (of the below example (i)) includes a core circuit section 1b and an I/O circuit section 1a formed by MOSFETs having oxide layers of the same, addition of older-generation MOSFETs able to be operated on a high voltage as the converting circuits 21 and 22 enables the present invention to function on the above LSI.

FIG. 12 is a perspective view schematically showing an LSI (especially, the LSI 1 having a MOSFET for an I/O circuit section 1a operated on a higher voltage than that for a MOSFET of the core circuit section 1b) to which the method for measure a voltage fluctuation waveform of the present invention is applied. FIG. 13 is a plain view showing an enlargement of the main part of the LSI 1 of FIG. 12. FIG. 13 is a perspective view schematically showing an example in which a power source system of the I/O circuit section 1a is shared by the I/O circuit section 1a and the measurement circuit unit 20 (the converting circuits 21 and 22) of the LSI 1 of FIGS. 12 and 13. In these FIGS. 12–14, symbol 1c represents a functional circuit block (corresponding to the functional circuit unit 10); symbol 1d represents an upper power source wiring; symbol 1e is a lower power source wiring; and symbol 1g represents a VIA.

An older-generation MOSFET technology (a gate length and an oxide layer thickness) is preferably applied to a MOSFET that is operated on a higher voltage. Since a latest-generation MOSFET is featured by the inclination of Vgs-Ids characteristic curve at the shortest gate length Lg largely varies depending upon the drain-source voltage Vgs, such a latest MOSFET cannot used as the converting circuit 21 or 22 even if the latest MOSFET is operated on a high voltage. This is caused by the short channel effect. Prevention of the occurrence of the short channel effect requires elongation of the gate length Lg. Excessive elongation results in decrease of Ids and increase of a channel resistance causing decrease of performance dealing with Vgs fluctuation, so that it is preferable that the gate length Lg is made as short as possible. Assuming that the minimum gate length of an older-generation MOSFET is Lg_old, since the technology for the latest-generation channel-forming process can efficiently inhibit the short channel effect when the gate length is Lg_old, use of old-generation MOSFETs having the gate length Lg_old as the MOSFETs 21a and 22a for the converting circuits 21 and 22 can obtain experience and cost advantages.

On the basis of the above description, an LSI 1 including the apparatus (the converting circuits 21 and 22) for measuring a voltage fluctuation waveform of the present invention takes the form of the following examples (i)–(iii).

(i) an LSI with a function for measuring a voltage fluctuation waveform, having a MOSFET (an older-generation MOSFET) having a single kind of an oxide layer and added MOSFETs that are able to be operated on a high voltage and that are to be used as the converting circuits 21 and 22.

(ii) an LSI with a function for measuring a voltage fluctuation waveform, in the form of an LSI (a latest-generation LSI) having two kinds of oxide layers and having MOSFETs that are able to be operated on high voltage and that are used as the converting circuits 21 and 22.

(iii) as shown in FIG. 14, an LSI of the above example (ii) with a function for measuring a voltage fluctuation waveform, in which the power source wiring 1f for the high-voltage-operated MOSFET 22a is connected to the power source wiring 1h for the I/O circuit and the power source wiring 1h for I/O circuit is used as the power source system for the I/O circuit section 1a and the power source system 2 for the MOSFET 22a so that the power source voltage for the power source wiring 1h for I/O circuit is switched and converted to generate power source voltage for the MOSFET 22a and operate the converting circuit 22.

(7) Results of the first embodiment:

As described above, since a voltage fluctuation waveforms of the power-source system and/or the grounded system of the functional circuit 11 that is operated on a low voltage are converted into electric current waveforms near a desired measurement point and are then output outside the LSI 1, an voltage fluctuation waveform of even an LSI 1 having a number of wiring layers and being operated on a low voltage can be accurately measured without being subjected to a process such as FIB. Namely, the measurement method does not accompany a destruction inspection process and can obtain an accurate voltage fluctuation waveform. It is therefore possible to surely fulfill the request for realization of comparison and verification between results of voltage fluctuation waveforms obtained by a simulation performed during wiring design and by actual measurement performed on a final product LSI 1.

When the grounded system 2 of the power-source-system waveform converting circuit 21 is disconnected from the grounded system 1 of the functional circuit 11, a potential fluctuation waveform relative to a ground level of an external voltage source connected to the power source system 1 of the functional circuit 11 is converted into an electric current waveform and the electric current waveform is output outside the LSI 1 whereupon the potential fluctuation waveform can be accurately measured. The measurement apparatus shown in FIG. 4 can causes the converting circuits 21 and 22 to separately measure individual potentials (voltage fluctuation waveforms) of the power-source system 1 and the grounded system 1 of the functional circuit 11 by disconnecting the grounded system 1 from the grounded system 2 as described above.

On the other hand, connection of the grounded system 2 of the power-source-system waveform converting circuit 21 to the grounded system 1 of the functional circuit 11 converts a potential fluctuation waveform of a potential between the power-source system 1 and the grounded system 1 of the functional circuit 11 into an electric current waveform, which is to be output outside of the LSI 1, so that it is possible to measure an accurate potential fluctuation waveform.

Further, the pads 31 and 32 are respectively connected to power-source systems that respectively supply the second and the third rated voltages that are higher than the first rated voltage of the functional circuit 11 through the resistors 51 and 52 so that voltage fluctuation waveforms (electric current waveforms) can be enlarged by an appropriate resistor-divider ratio and can be measured. Adjustment to sizes of a transistor of the n-channel MOSFET 21a in the power-source-system waveform converting circuit 21 and a transistor of the p-channel MOSFET 22a in the grounded-system waveform converting circuit 22 and on resistances of the resistors 51 and 52 can adjust sensitivity to electric current conversion. As a result, the present invention can be effectively applied to measurement of a voltage fluctuation waveform even if improvement of an LSI technology lowers a voltage to operate an LSI 1 and an absolute value of the fluctuation is thereby reduced.

(8) Others:

The present invention should be by no means limited to the foregoing first embodiment and various modification and change can be suggested without departing from the gist of the present invention.

For example, the LSI 1 includes both converting circuits 21 and 22. Alternatively, the LSI 1 may include either converting circuit 21 or 22.

What is claimed is:

1. An apparatus for measuring a voltage fluctuation waveform of a power source system of a functional circuit operated on a first rated voltage in a semiconductor integrated circuit, comprising:

a power-source-system waveform converting circuit, disposed close to the functional circuit and in the semiconductor integrated circuit and operated on a second rated voltage higher than the first rated voltage, for converting said voltage fluctuation waveform of the power source system into an electrical current waveform;

a power-source-system fluctuation waveform output terminal for outputting said electric current waveform obtained by said power-source-system waveform converting circuit outside the semiconductor integrated circuit; and a power-source-system fluctuation waveform output wiring, arranged in the semiconductor integrated circuit, for connecting said power-source-system waveform converting circuit and said power-source-system fluctuation waveform output terminal.

2. An apparatus according to claim 1, wherein, when a grounded system of said power-source-system waveform converting circuit is disconnected from a grounded system of the functional circuit, said power-source-system waveform converting circuit converts a potential fluctuation waveform relative to a ground level of an external voltage source connected to the power source system of the functional circuit, which potential fluctuation waveform is in the form of said voltage fluctuation waveform of the power source system, into said electric current waveform.

3. An apparatus according to claim 1, wherein a grounded system for an I/O circuit of the semiconductor integrated circuit is used as a grounded system of said power-source-system waveform converting circuit.

4. An apparatus according to claim 1, wherein, when a grounded system of said power-source-system waveform converting circuit is connected to a grounded system of the functional circuit, said power-source-system waveform converting circuit converts a potential fluctuation waveform of a potential between the power source system and the grounded system of the functional circuit, which potential fluctuation waveform is in the form of said voltage fluctuation waveform of the power source system, into said electric current waveform.

5. An apparatus according to claim 1, wherein:

said power-source-system waveform converting circuit is an n-channel MOSFET (metal-oxide-semiconductor field effect transistor);

the gate terminal of the n-channel MOSFET is connected to the power source system of the functional circuit;

the source terminal of the n-channel MOSFET is connected to a grounded system of said power-source-system waveform converting circuit; and the drain terminal of the n-channel MOSFET is connected to said power-source-system fluctuation waveform output terminal through said power-source-system fluctuation waveform output wiring.

6. An apparatus according to claim 1, wherein said power-source-system fluctuation waveform output terminal is connected to a power source system which supplies the second rated voltage and which is disposed outside the semiconductor integrated circuit.

7. An apparatus according to claim 6, wherein a first resistor having a first predetermined resistance is interposed between said power-source-system fluctuation waveform output terminal and the power source system that supplies the second rated voltage.

8. An apparatus for measuring a voltage fluctuation waveform of a grounded system of a functional circuit operated on a first rated voltage in a semiconductor integrated circuit, comprising:

a grounded-system waveform converting circuit, disposed close to the functional circuit and in the semiconductor integrated circuit and operated on a third rated voltage higher than the first rated voltage, for converting said voltage fluctuation waveform of the grounded system into an electrical current waveform;

a grounded-system fluctuation waveform output terminal for outputting said electric current waveform obtained by said grounded-system fluctuation waveform converting circuit outside the semiconductor integrated circuit; and a grounded-system fluctuation waveform output wiring, arranged in the semiconductor integrated circuit, for connecting said grounded-system waveform converting circuit and said grounded-system fluctuation waveform output terminal.

9. An apparatus according to claim 8, wherein said grounded-system waveform converting circuit is connected to a power source system different from the power source system of the functional circuit.

10. An apparatus according to claim 9, wherein a power source system for an I/O circuit of the semiconductor integrated circuit is used as the power source system that is connected to said grounded-system waveform converting circuit.

11. An apparatus according to claim 8, wherein, when a power source system of said grounded-system waveform converting circuit is connected to a power source system of the functional circuit, said grounded-system waveform converting circuit converts a potential fluctuation waveform of a potential between the power source system and the grounded system of the functional circuit, which potential fluctuation waveform is in the form of said voltage fluctuation waveform of the grounded system, into said electric current waveform.

12. An apparatus according to claim 8, wherein:

said grounded-system waveform converting circuit is a p-channel MOSFET (metal-oxide-semiconductor field effect transistor);

the gate terminal of the p-channel MOSFET is connected to the grounded system of the functional circuit;

the drain terminal of the p-channel MOSFET is connected to a power source system of said grounded-system waveform converting circuit; and the source terminal of the p-channel MOSFET is connected to said grounded-system fluctuation waveform output terminal through said grounded-system fluctuation waveform output wiring.

13. An apparatus according to claim 8, wherein said grounded-system fluctuation waveform output terminal is connected to a power source system which supplies the third rated voltage and which is disposed outside the semiconductor integrated circuit.

14. An apparatus according to claim 13, wherein a second resistor having a second predetermined resistance is interposed between said grounded-system fluctuation waveform output terminal and the power source system that supplies the third rated voltage.

15. An apparatus for measuring a voltage fluctuation waveform of a power source system of a functional circuit operated on a first rated voltage in a semiconductor integrated circuit and a voltage fluctuation waveform of a grounded system of the functional circuit, comprising:

a power-source-system waveform converting circuit, disposed close to the functional circuit and in the semiconductor integrated circuit and operated on a second rated voltage higher than the first rated voltage, for converting said voltage fluctuation waveform of the power source system into an electrical current waveform;

a grounded-system waveform converting circuit, disposed close to the functional circuit and in the semiconductor integrated circuit and operated on a third rated voltage higher than the first rated voltage, for converting said voltage fluctuation waveform of the grounded system into an electrical current waveform;

a power-source-system fluctuation waveform output terminal for outputting said first electric current waveform obtained by said power-source-system waveform converting circuit outside the semiconductor integrated circuit;

a grounded-system fluctuation waveform output terminal for outputting said second electric current waveform obtained by said grounded-system fluctuation waveform converting circuit outside the semiconductor integrated circuit;

a power-source-system fluctuation waveform output wiring, arranged in the semiconductor integrated circuit, for connecting said power-source-system waveform converting circuit and said power-source-system fluctuation waveform output terminal; and a grounded-system fluctuation waveform output wiring, arranged in the semiconductor integrated circuit, for connecting said grounded-system waveform converting circuit and said grounded-system fluctuation waveform output terminal.

16. An apparatus according to claim 15, wherein, when a grounded system of said power-source-system waveform converting circuit is disconnected from the grounded system of the functional circuit, said power-source-system waveform converting circuit converts a potential fluctuation waveform relative to a ground level of an external voltage source connected to the power source system of the functional circuit, which potential fluctuation waveform is in the form of said voltage fluctuation waveform of the power source system, into said electric current waveform.

17. An apparatus according to claim 15, wherein said grounded-system waveform converting circuit is connected to a power source system different from the power source system of the functional circuit.

18. An apparatus according to claim 16, wherein said grounded-system waveform converting circuit is connected to a power source system different from the power source system of the functional circuit.

19. An apparatus according to claim 17, wherein a power source system for an I/O circuit of the semiconductor integrated circuit is used as the power source system that is connected to said grounded-system waveform converting circuit.

20. An apparatus according to claim 18, wherein a power source system for an I/O circuit of the semiconductor integrated circuit is used as the power source system that is connected to said grounded-system waveform converting circuit.

21. An apparatus according to claim 15, wherein:

said power-source-system waveform converting circuit is an n-channel MOSFET (metal-oxide-semiconductor field effect transistor);

the gate terminal of the n-channel MOSFET is connected to the power source system of the functional circuit;

the source terminal of the n-channel MOSFET is connected to a grounded system of said power-source-system waveform converting circuit;

the drain terminal of the n-channel MOSFET is connected to said power-source-system fluctuation waveform output terminal through said power-source-system fluctuation waveform output wiring;

said grounded-system waveform converting circuit is a p-channel MOSFET;

the gate terminal of the p-channel MOSFET is connected to the grounded system of the functional circuit;

the drain terminal of the p-channel MOSFET is connected to the power source system of said grounded-system waveform converting circuit; and the source terminal of the p-channel MOSFET is connected to said grounded-system fluctuation waveform output terminal through said grounded-system fluctuation waveform output wiring.

22. An apparatus according to claim 15, wherein:

said power-source-system fluctuation waveform output terminal is connected to a power source system which supplies the second rated voltage and which is disposed outside the semiconductor integrated circuit; and said grounded-system fluctuation waveform output terminal is connected to a power source system which supplies the third rated voltage and which is disposed outside the semiconductor integrated circuit.

23. An apparatus according to claim 22, wherein:

a first resistor having a first predetermined resistance is interposed between said power-source-system fluctuation waveform output terminal and the power source system that supplies the second rated voltage; and a second resistor having a second predetermined resistance is interposed between said grounded-system fluctuation waveform output terminal and the power source system that supplies the second rated voltage.

24. A semiconductor integrated circuit including a functional circuit, being operated on a first rated voltage, and having a function for measuring a voltage fluctuation waveform of a power source system of the functional circuit, comprising:

a power-source-system waveform converting circuit, disposed close to the functional circuit and in said semiconductor integrated circuit and operated on a second rated voltage higher than the first rated voltage, for converting said voltage fluctuation waveform of the power source system into an electrical current waveform;

a power-source-system fluctuation waveform output terminal for outputting said electric current waveform obtained by said power-source-system waveform converting circuit outside said semiconductor integrated circuit; and a power-source-system fluctuation waveform output wiring for connecting said power-source-system waveform converting circuit and said power-source-system fluctuation waveform output terminal.

25. A semiconductor integrated circuit including a functional circuit, being operated on a first rated voltage, and having a function for measuring a voltage fluctuation waveform of a grounded system of the functional circuit, comprising:

a grounded-system waveform converting circuit, disposed close to the functional circuit and in said semiconductor integrated circuit and operated on a third rated voltage higher than the first rated voltage, for converting said voltage fluctuation waveform of the grounded system into an electrical current waveform;

a grounded-system fluctuation waveform output terminal for outputting said electric current waveform obtained by said grounded-system fluctuation waveform converting circuit outside said semiconductor integrated circuit; and a grounded-system fluctuation waveform output wiring for connecting said grounded-system waveform converting circuit and said grounded-system fluctuation waveform output terminal.

26. A semiconductor integrated circuit including a functional circuit, being operated on a first rated voltage, and having a function for measuring a voltage fluctuation waveform of a power source system of the functional circuit and a voltage fluctuation waveform of a grounded system of the functional circuit, comprising:

a power-source-system waveform converting circuit, disposed close to the functional circuit and in said semiconductor integrated circuit and operated on a second rated voltage higher than the first rated voltage, for converting said first voltage fluctuation waveform of the power source system into an electrical current waveform;

a grounded-system waveform converting circuit, disposed close to the functional circuit and in said semiconductor integrated circuit and operated on a third rated voltage higher than the first rated voltage, for converting said second voltage fluctuation waveform of the grounded system into an electrical current waveform;

a power-source-system fluctuation waveform output terminal for outputting said first electric current waveform obtained by said power-source-system waveform converting circuit outside said semiconductor integrated circuit;

a grounded-system fluctuation waveform output terminal for outputting said second electric current waveform obtained by said grounded-system fluctuation waveform converting circuit outside said semiconductor integrated circuit;

a power-source-system fluctuation waveform output wiring for connecting said power-source-system waveform converting circuit and said power-source-system fluctuation waveform output terminal; and a grounded-system fluctuation waveform output wiring for connecting said grounded-system waveform converting circuit and said grounded-system fluctuation waveform output terminal.

\* \* \* \* \*

UNITED STATES PATENT AND TRADEMARK OFFICE
CERTIFICATE OF CORRECTION

PATENT NO. : 6,847,222 B2
DATED : January 25, 2005
INVENTOR(S) : Keisuke Muraya et al.

It is certified that error appears in the above-identified patent and that said Letters Patent is hereby corrected as shown below:

Title page,
Item [57], ABSTRACT,
Line 4, change "propose" to -- purpose --.

Column 17,
Line 23, after "and", insert a new paragraph.

Signed and Sealed this

Twenty-third Day of August, 2005

JON W. DUDAS
*Director of the United States Patent and Trademark Office*